United States Patent [19]

Thrush et al.

[11] Patent Number: 5,403,195

[45] Date of Patent: Apr. 4, 1995

[54] SOCKET HAVING AN AUXILIARY ELECTRICAL COMPONENT MOUNTED THEREON

[75] Inventors: Roger L. Thrush, Clemmons; Kevin Snead, Greensboro, both of N.C.

[73] Assignee: The Whitaker Corporation, Wilmington, Del.

[21] Appl. No.: 248,136

[22] Filed: May 24, 1994

[51] Int. Cl.⁶ .......................................... H01R 13/66
[52] U.S. Cl. ..................................... 439/69; 439/620
[58] Field of Search ........................... 439/69, 620, 70

[56] References Cited

U.S. PATENT DOCUMENTS

| | | | |
|---|---|---|---|
| 3,697,818 | 10/1972 | Boursin | 439/55 |
| 3,880,493 | 4/1975 | Lockhart, Jr. | 439/525 |
| 4,060,296 | 11/1977 | Kunkle et al. | 439/70 |
| 4,072,380 | 2/1978 | Freehauf | 439/620 |
| 4,089,041 | 5/1978 | Lockard | 439/68 |
| 4,356,532 | 10/1982 | Donaher et al. | 439/69 |
| 4,377,319 | 5/1983 | MacDougall | 439/264 |
| 4,405,188 | 9/1983 | Schwartz | 439/70 |
| 4,428,633 | 1/1984 | Lundergan et al. | 439/70 |
| 4,478,472 | 10/1984 | Baar | 439/296 |
| 4,539,621 | 9/1985 | Currier | 439/70 |
| 4,726,776 | 2/1988 | Billman et al. | 439/620 |
| 5,184,285 | 2/1993 | Murphy et al. | 439/70 |
| 5,196,374 | 3/1993 | Hundt et al. | 439/70 |

*Primary Examiner*—Gary F. Paumen
*Attorney, Agent, or Firm*—Robert J. Kapalka

[57] ABSTRACT

A socket for an electrical component comprises a dielectric housing (10) having contact retention cavities (12) and contacts (20) disposed in respective ones of the cavities. At least two of the contacts (20) each comprises a generally U-shaped configuration having first and second legs (21, 22) with a transverse element (23) joining together said legs. An extension (24) of the first leg (21) is bent back toward the second leg (22) and arranged to engage a lead of the electrical component. A tab (26) sheared from a center portion of the transverse element (23) and the first leg (21) extends downwardly from the second leg (22) through an aperture in a bottom of its respective cavity, thereby defining a slot (27) in the center portion of the transverse element and the first leg. An auxiliary electrical component (30) mounted on the socket has at least two leads (32) each of which is electrically terminated to a respective one of the at least two contacts by engagement between sides of the slot (27) in its respective contact.

6 Claims, 5 Drawing Sheets

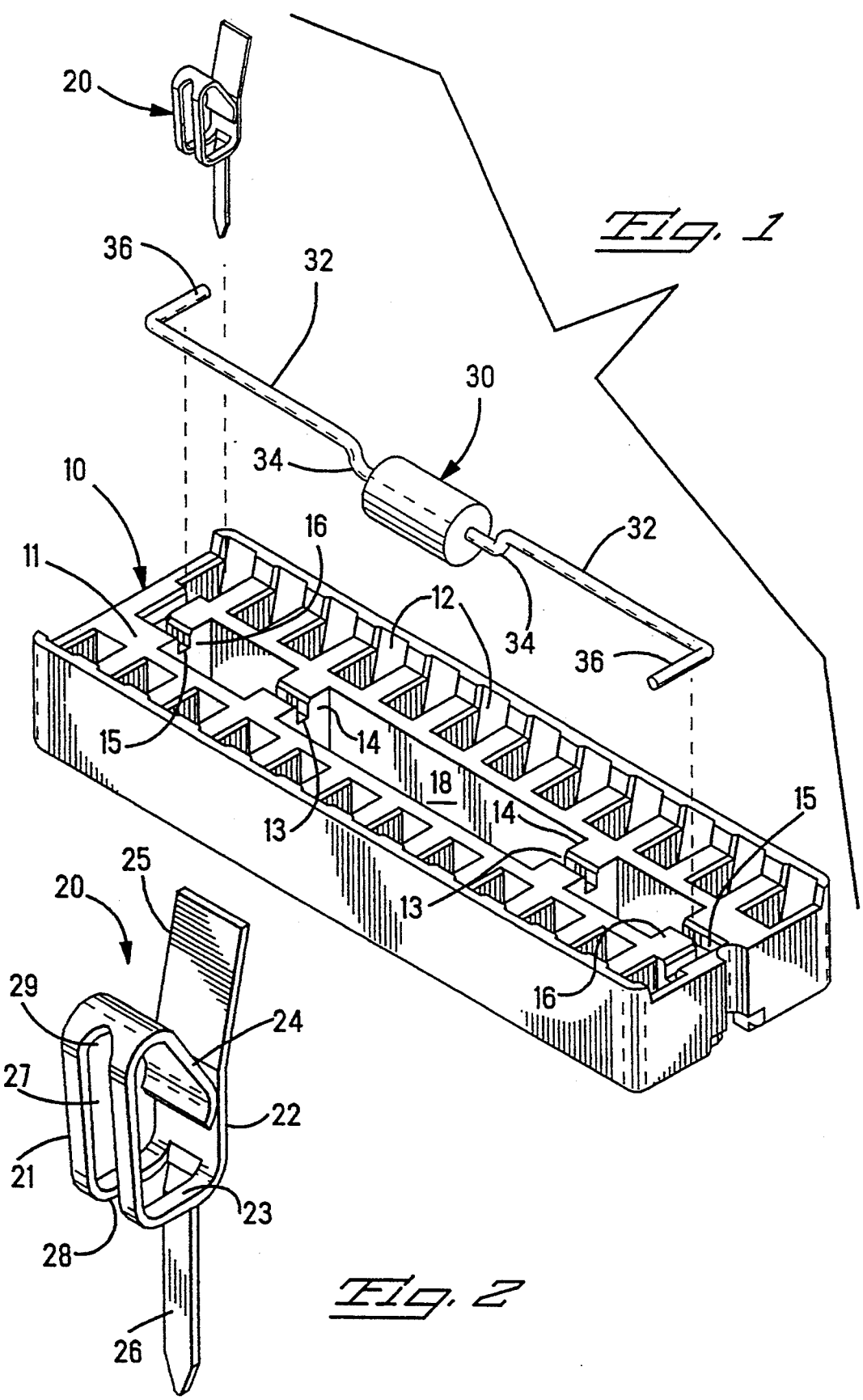

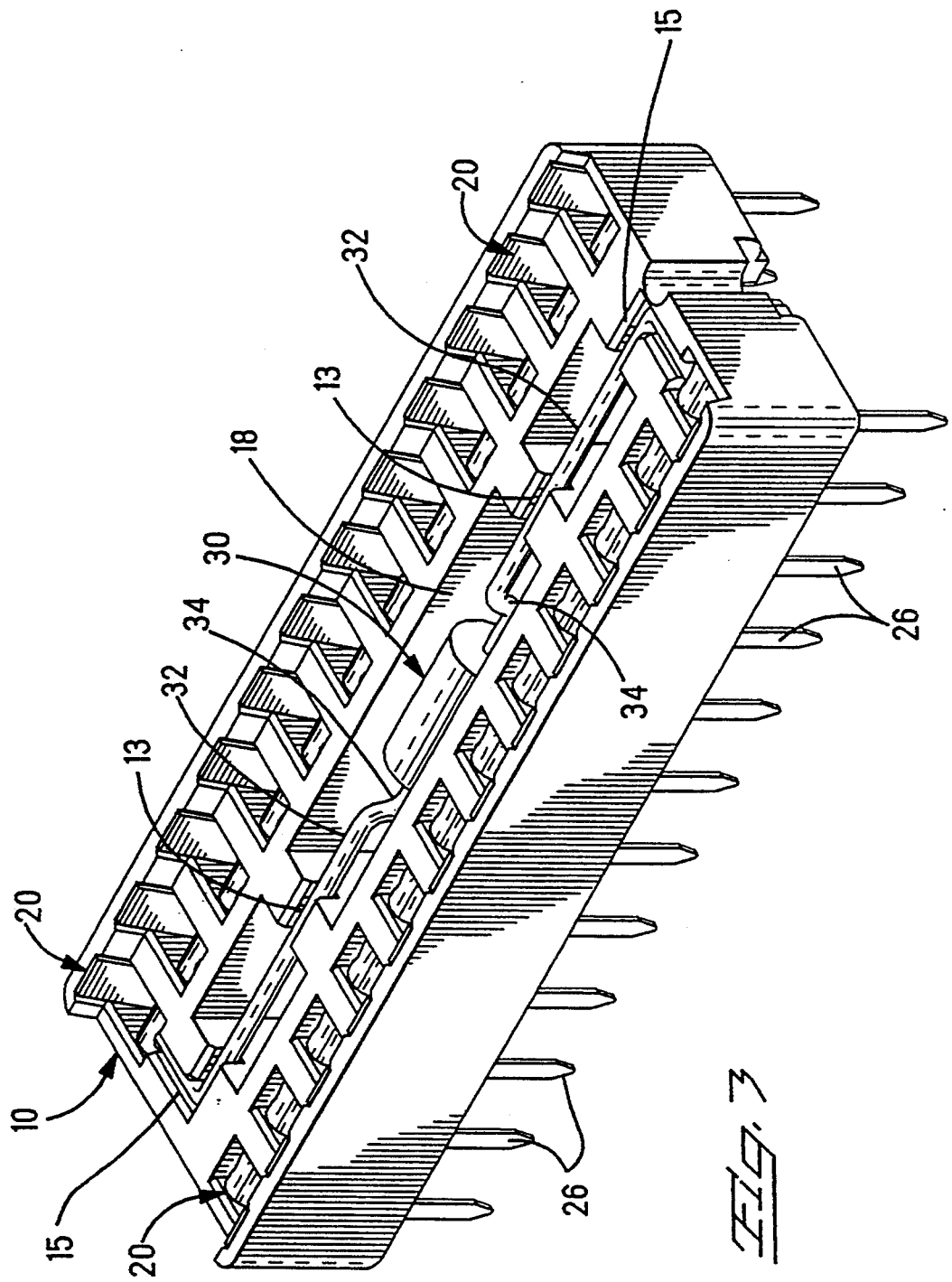

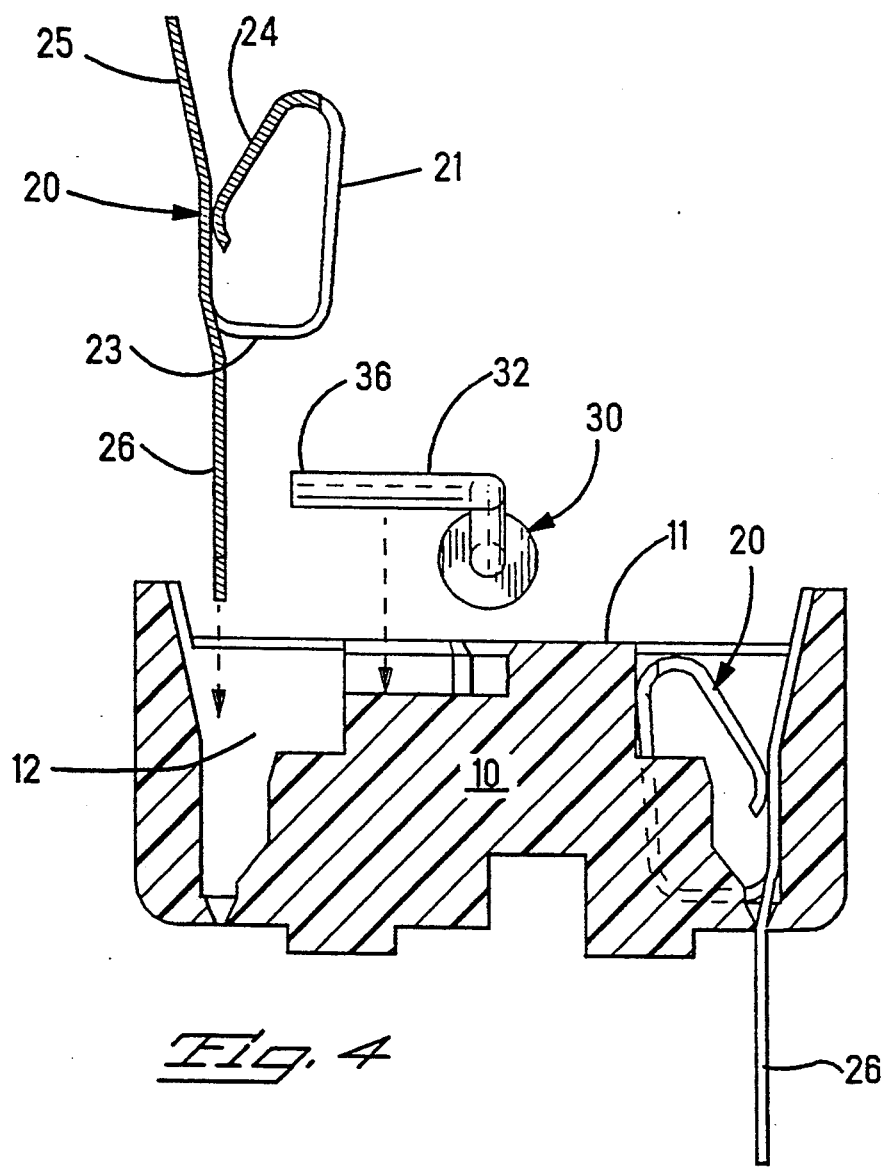
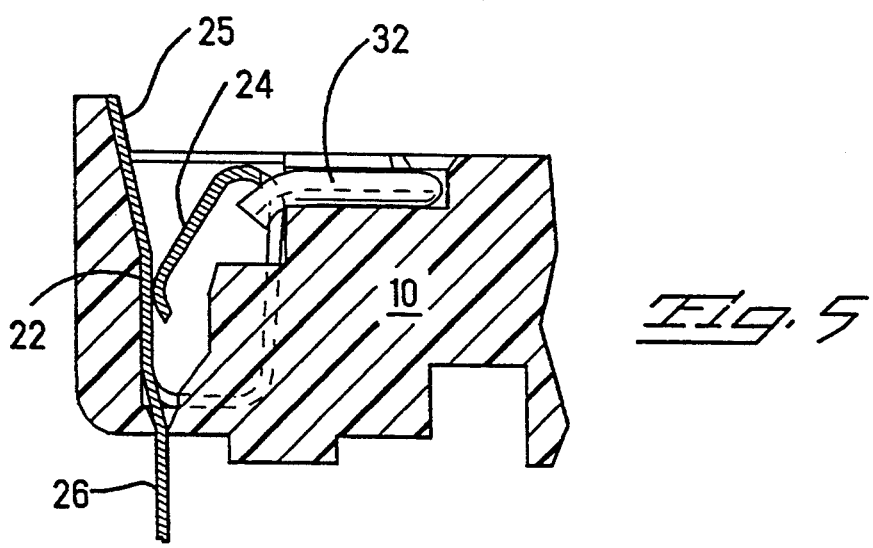

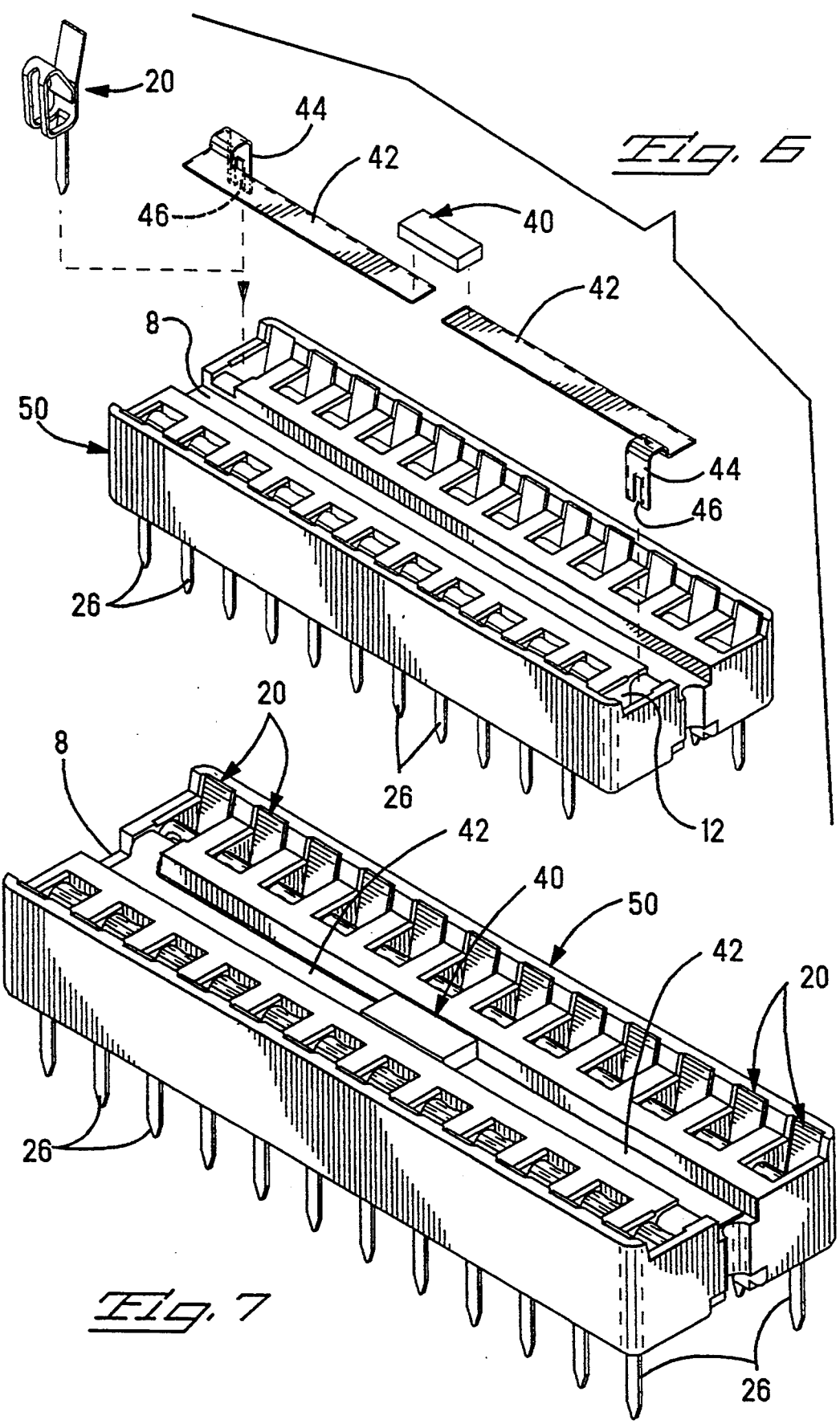

SOCKET HAVING AN AUXILIARY ELECTRICAL COMPONENT MOUNTED THEREON

FIELD OF THE INVENTION

The invention is related to a socket for removably mounting an electrical component wherein the socket has an auxiliary electrical component secured thereto.

BACKGROUND OF THE INVENTION

Electrical circuit elements are commonly housed in packages having a plurality of leads disposed in an array. One such package is a dual-in-line package (DIP) having two rows of leads extending from opposite sides thereof and bent downwardly.

U.S. Pat. No. 4,060,296 discloses a DIP socket for removably mounting a DIP on a circuit board. This socket includes contacts each made from a single piece of metal which is formed into a generally U-shaped configuration. Each of the contacts has dual leaves which provide metal to metal contact on opposite sides of each lead of the DIP.

There is often a need to connect an auxiliary electrical circuit component to the DIP socket along with the DIP package itself. For example, decoupling capacitors are often needed to prevent electrical damage to an integrated circuit package in the event that the package is withdrawn from the socket when power is on.

U.S. Pat. No. 4,428,633 discloses a DIP socket having a capacitor attached thereto. The socket utilizes contacts of the aforementioned configuration for engaging leads of the DIP and has a further pair of single piece auxiliary contacts dedicated to terminating leads of the capacitor. Each of the auxiliary contacts has a slot which is dimensioned to grip one of the leads of the capacitor between walls of the slot. The auxiliary contacts are housed in the socket with their solder tails being abutted against respective solder tails of power and ground contacts in the socket.

There are a number of problems associated with this socket. The primary contacts and the auxiliary contacts are inserted into the socket from opposite directions, thereby increasing manufacturing complexity. Alignment of paired primary and auxiliary contacts is critical in order to achieve good surface contact between the abutting solder tails, and binding can occur during contact insertion which may distort one contact or flare the solder tails apart. Further, the abutting solder tails comprise an additional electrical interconnection having the potential for failure.

U.S. Pat. No. 4,405,188 discloses another DIP socket and capacitor assembly. The socket housing has a plurality of primary cavities each of which receives a contact. A pair of the primary cavities each have a secondary cavity formed adjacent and contiguous thereto for receiving a lead of the capacitor. When a contact is inserted into one of the pair of primary cavities an interference fit is formed with the lead in the secondary cavity. There is an additional manufacturing cost associated with forming the secondary cavities and ensuring that they are aligned with their respective primary cavities to within close tolerances.

It would be economically advantageous to provide a socket with a capacitor or other auxiliary electrical component mounted thereon without the need for special contacts or cavities in the socket.

SUMMARY OF THE INVENTION

It is an object of the invention to provide an economical socket having an auxiliary electrical component mounted thereon.

It is another object of the invention to simplify the assembly of an auxiliary electrical component on a socket.

It is a further object of the invention to incorporate an auxiliary electrical component into an existing socket without substantial change to the socket.

These and other objects are accomplished by a socket for an electrical component comprising a dielectric housing having contact retention cavities and contacts disposed in respective ones of the cavities. At least two of the contacts each comprise a generally U-shaped configuration having first and second legs with a transverse element joining together said legs. An extension of the first leg is bent back toward the second leg and arranged to engage a lead of the electrical component. A tab sheared from a center portion of the transverse element and the first leg extends downwardly from the second leg through an aperture in a bottom of its respective cavity, thereby defining a slot in the center portion of the transverse element and the first leg. An auxiliary electrical component mounted on the socket has at least two leads each of which is electrically terminated to a respective one of the at least two contacts by engagement between sides of the slot in its respective contact.

BRIEF DESCRIPTION OF THE DRAWINGS

The invention will now be described by way of example with reference to the accompanying drawings in which like elements in different figures thereof are identified by the same reference numeral and wherein:

FIG. 1 is an exploded isometric view of a socket according to the invention.

FIG. 2 is an isometric view of a contact used in the socket.

FIG. 3 is an isometric view of a socket assembly according to the invention.

FIG. 4 is an exploded cross-sectional view of the socket.

FIG. 5 is a cross-sectional view of the socket assembly.

FIG. 6 is an exploded isometric view of an alternative embodiment of the socket.

FIG. 7 is an isometric view of the alternative embodiment socket assembly.

DETAILED DESCRIPTION OF THE PREFERRED EMBODIMENT

Figure 8:
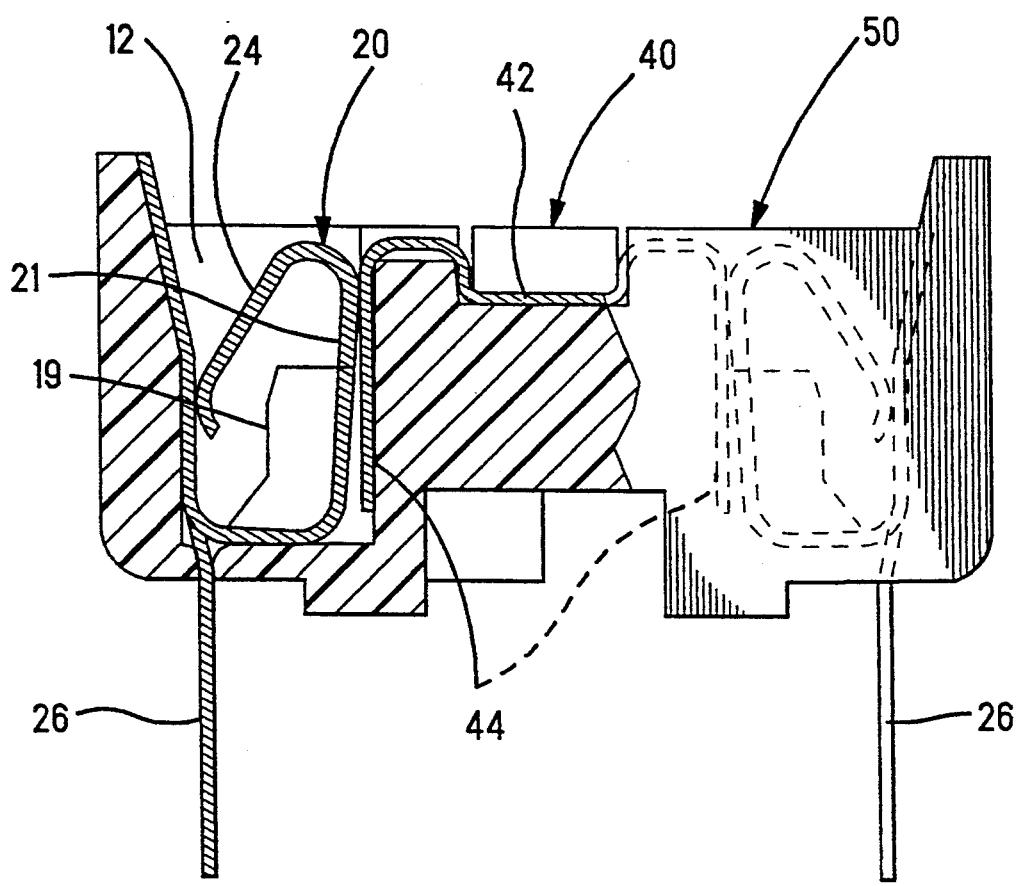
FIG. 8 is a cross-sectional view of the alternative embodiment.

There is shown in FIG. 1 a DIP socket comprising a dielectric housing 10 having two parallel rows of contact retention cavities 12 each of which is adapted to receive, stabilize, orient and retain a contact such as contact 20 which is shown exploded out of the housing 10. Each of the contacts 20 receives and frictionally retains a lead of a DIP package (not shown) which is inserted onto the socket from above.

The housing is adapted to accommodate an auxiliary electrical component such as decoupling capacitor 30 having leads 32 extending therefrom. The leads 32 preferably have a circular cross-section. Grooves 13 in mid-ribs 14 and grooves 15 in end-ribs 16 are sized to closely receive the leads 32 in an interference fit. The grooves 15 are right-angled and terminate at a pair of the cavities 12 which are normally associated with power and ground circuits of the DIP package.

As shown in FIG. 2, the contact 20 has a generally U-shaped configuration with first and second legs 21, 22 of the "U" being joined together by a transverse element 23. The first leg 21 has an extension 24 which is bent back across a channel of the "U" toward the second leg and is arranged to cooperate with the second leg to engage one of the leads of the DIP package. An extension 25 of the second leg 22 is angled outwardly from the channel of the "U" so as to guide a lead of the DIP package into the channel between the second leg 22 and the extension 24. A tab 26 which is sheared from a center portion of the transverse element 23 and the first leg 21 extends downwardly from the second leg 22. When the contact 20 is disposed in the socket the tab 26 extends through an aperture in a bottom of its respective cavity 12 in the socket housing 10 and provides a solder tail for the contact 20. After the tab 26 is sheared, a void remaining in the transverse element 23 and the first leg 21 defines a slot 27. A width of the tab 26, and thus a width of the slot 27, is preselected to enable termination one of the leads 32 in the slot 27 as will be more fully described hereinafter.

Referring now to FIGS. 1 and 3-5, the capacitor 30 is secured to the bare housing 10 by wedging the leads 32 into the grooves 13 and 15, thereby deforming walls of the grooves 13 and 15 around the leads 32. The capacitor 30 resides in cavity 18 suspended from the leads 32. The leads 32 have bends 34 which allow the capacitor 30 to be disposed below top surface 11 of the housing 10, thereby avoiding interference with the DIP package which will be mounted on the socket. After inserting the capacitor, remote ends 36 of the leads are disposed in their respective cavities 12 directly along insertion paths of the contacts.

In a preferred embodiment, one of the contacts 20 is inserted into each of the cavities 12 of the socket. However, other configurations of contacts may be used in the socket as long as at least two contacts having the slot 27 are inserted into the cavities which are associated with the leads 32. These contacts are inserted along insertion paths which intersect the ends 36 of the leads 32. As one of the contacts 20 enters its cavity, the end 36 of the lead enters the slot 27. Preferably the end 36 extends only partially across the width of its cavity so as not to interfere with other portions of the contact.

The slot 27 has a width which is preselected by appropriate selection of the width of the tab 26. Referring to FIG. 2, from entranceway 28 of the slot at a lower end thereof and along a majority of its length the slot has a width which is slightly greater than the cross-sectional width, i.e., the diameter, of the lead 32. Sides of the slot converge at its upper termination end 29 so that at some point the slot width is incrementally narrower than the diameter of the lead 32. As the contact nears full insertion in its cavity the lead 32 becomes engaged between the converging sides of the termination end 29 of the slot. In a preferred embodiment the diameter of the lead is 0.020 inch, the nominal width of the slot is 0.024 inch, and at full insertion of the contact the lead is engaged in a portion of the slot having a width of 0.018 inch.

In an alternate embodiment of the invention as shown in FIGS. 6-8, a socket housing 50 uses the same contacts 20 to accommodate an auxiliary component such as capacitor 40 which is surface mount soldered to flat metal leads 42. The housing 50 has a longitudinal groove 8 which may be formed directly in the housing, or an insert having the appropriately sized groove 8 may be preliminarily secured to the housing. The leads 42 without the capacitor 40 are secured to the housing 50 by wedging the leads between walls of the groove 8. An end portion 44 of each lead extends at a right angle therefrom and is configured to reside against an interior wall of one of the cavities 12. The end portion 44 is formed with a notch 46 which provides clearance for an interior rib 19 of the cavity. When the contact 20 is inserted into the cavity having the end portion 44 of the lead, the first leg 21 is resiliently deflected by the thickness of the end portion 44, thereby applying a normal force to the end portion 44 and providing an electrical connection therewith, as best seen in FIG. 8. The capacitor 40 may be surface mount soldered to the leads 42 either before or after insertion of the contacts 20 in the housing.

The invention having been disclosed, a number of variations will now become apparent to those skilled in the art. Whereas the invention is intended to encompass the foregoing preferred embodiments as well as a reasonable range of equivalents, reference should be made to the appended claims rather than the foregoing discussion of examples, in order to assess the scope of the invention in which exclusive rights are claimed.

We claim:

1. A socket for an electrical component, comprising:
   a dielectric housing having contact retention cavities;
   at least two contacts disposed in respective ones of said cavities, each of said at least two contacts comprising:
      a generally U-shaped configuration having first and second legs with a transverse element joining together said legs;
      a tab sheared from a center portion of said transverse element and said first leg and extending downwardly from said second leg through an aperture in a bottom of its respective said cavity, thereby defining a slot in said center portion of said transverse element and said first leg; and,
   an auxiliary electrical component mounted on said housing and having at least two leads extending therefrom, each of said at least two leads being electrically terminated to a respective one of said at least two contacts by engagement between sides of a respective said slot.

2. A socket for an electrical component, comprising:
   a dielectric housing having contact retention cavities;
   contacts disposed in respective ones of said cavities, at least two of said contacts each comprising:
      a generally U-shaped configuration having first and second legs with a transverse element joining together said legs;
      an extension of said first leg being bent back toward said second leg and arranged to cooperate with said second leg to engage a lead of said electrical component; and,
      a tab sheared from a center portion of said transverse element and said first leg and extending downwardly from said second leg through an aperture in a bottom of its respective said cavity, thereby defining a slot in said center portion of said transverse element and said first leg; and,
   an auxiliary electrical component mounted on said housing and having at least two leads extending therefrom, each of said at least two leads being electrically terminated to a respective one of said at least two contacts by engagement between sides of a respective said slot.

3. A socket for an electrical component, comprising: a dielectric housing having contact retention cavities; contacts disposed in respective ones of said cavities, at least two of said contacts each comprising:

an integral body formed from a strip of material and including a pair of opposed leaves arranged to receive a lead of said electrical component therebetween, a tab extending downwardly from said body through an aperture in a bottom of its respective said cavity, thereby defining a slot in said strip of material; and, an auxiliary electrical component mounted on said housing and having at least two leads extending therefrom, each of said at least two leads being electrically terminated to a respective one of said at least two contacts by engagement between sides of a respective said slot.

4. A method of making a socket for an electrical component, comprising the steps of:

providing a dielectric housing having contact retention cavities;

providing an auxiliary electrical component with leads each having a preselected width;

securing said auxiliary electrical component to the housing such that said leads extend into respective contact insertion paths associated with respective ones of said cavities;

forming contacts each having a generally U-shaped configuration including first and second legs and a transverse element joining together said legs, a tab being sheared from a center portion of said transverse element and said first leg and extending downwardly from said second leg, thereby defining a slot in said center portion of said transverse element and said first leg, dimensions of said tab being selected such that said slot is incrementally narrower than said width of said leads, at least at an end of said slot; and, inserting individual ones of said contacts along said respective contact insertion paths into said cavities such that each of said leads is engaged between sides of a respective said slot, thereby terminating each of said leads to a respective said contact.

5. The method according to claim 4, wherein said contacts are formed with an extension of said first leg being bent back toward said second leg and arranged to cooperate with said second leg to engage a lead of said electrical component.

6. The method according to claim 5, wherein each of said leads has a length which is preselected to avoid interference with said extension of said first leg.

* * * * *